United States Patent [19]

Shida

[11] Patent Number: 5,610,427

[45] Date of Patent: Mar. 11, 1997

[54] ELECTROSTATIC PROTECTION DEVICE FOR USE IN SEMICONDUCTOR INTEGRATED CIRCUIT

[75] Inventor: Akira Shida, Tokyo, Japan

[73] Assignee: NEC Corporation, Tokyo, Japan

[21] Appl. No.: 636,146

[22] Filed: Apr. 22, 1996

[30] Foreign Application Priority Data

Apr. 20, 1995 [JP] Japan .................................. 7-095456

[51] Int. Cl.⁶ .................................................. H01L 23/62
[52] U.S. Cl. .......................................... 257/362; 257/356
[58] Field of Search .................................. 257/356, 362, 257/328

[56] References Cited

U.S. PATENT DOCUMENTS

| | | | |
|---|---|---|---|
| 4,821,089 | 4/1989 | Strauss .................................. | 257/328 |
| 4,994,874 | 2/1991 | Shimizu et al. ........................ | 257/362 |
| 5,001,529 | 3/1991 | Ohshima et al. ....................... | 257/362 |

*Primary Examiner*—Gene M. Munson

*Attorney, Agent, or Firm*—Sughrue, Mion, Zinn, Macpeak & Seas

[57] ABSTRACT

An electrostatic protection device for use in a semiconductor integrated circuit, includes a base region of a first conductivity type formed at a principal surface of a semiconductor substrate, a plurality of collector regions constituted of a plurality of first diffused regions of a second conductivity type opposite to the first conductivity type. The first diffused regions are formed on a surface of the base region in the form of a plurality of strips parallel to each other but separate from each other. Emitter regions are constituted of a second diffused region of the second conductivity type formed in the form of a strip between each pair of adjacent collector regions of the plurality of collector regions and a third diffused region of the second conductivity type formed under a contact hole formed in at least one portion of a boundary region at a side of the second diffused region adjacent to the collector region, the third diffused region being connected to the second diffused region. A base contact region of the first conductivity having a high impurity concentration is formed within the base region so as to substantially surround the collector regions and the emitter regions.

3 Claims, 9 Drawing Sheets

ELECTROSTATIC PROTECTION DEVICE FOR USE IN SEMICONDUCTOR INTEGRATED CIRCUIT

BACKGROUND OF THE INVENTION

1. Field of the invention

The present invention relates to an electrostatic protection device for use in a semiconductor integrated circuit.

2. Description of related art

Figure 1:
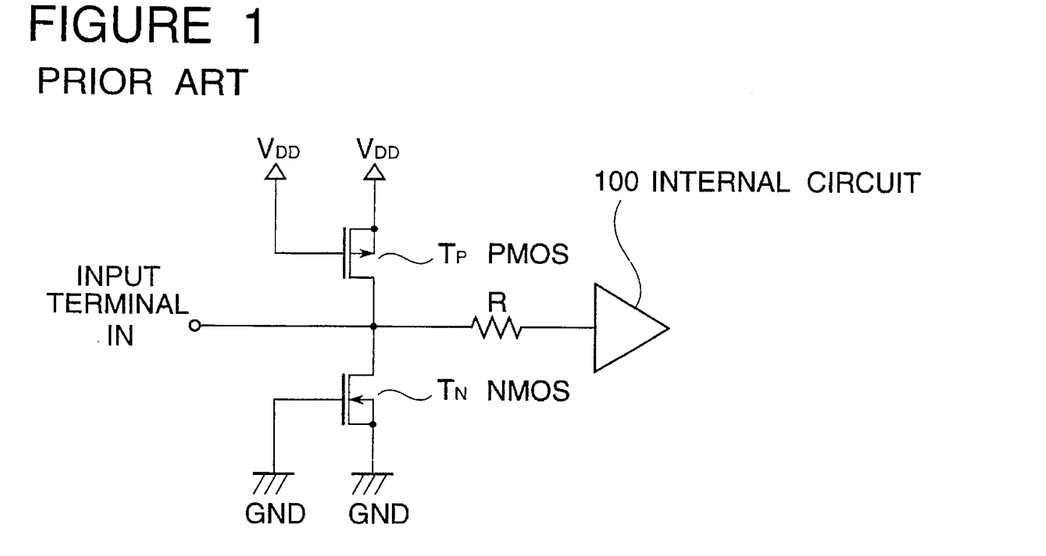
FIG. 1 is a circuit diagram of a first conventional electrostatic protection circuit including an electrostatic protection device.

Generally, an internal circuit of an LSI (large scaled integrated circuit) is protected from a surge applied to an input terminal, by action of an electrostatic protection device connected to the input terminal. In particular, in a MOS (metal oxide semiconductor) LSI, the surge applied to the input terminal is directly applied to a gate oxide film of an internal circuit, so as to cause an electrostatic destroy or break. In order to prevent this electrostatic destroy or break, for example a conventional electrostatic protection circuit includes an electrostatic protection device provided for an input buffer 100, as shown in FIG. 1. This electrostatic protection device includes a P-channel MOS transistor (called a "PMOS" transistor) TP connected between an input terminal IN and a power supply voltage VDD, and an N-channel MOS transistor (called a "NMOS" transistor) TN connected between the input terminal IN and ground GND. A gate of each of the MOS transistors TP and TN is connected to a source of the transistor itself. The input terminal IN is connected to an input of the input buffer 100. The shown electrostatic protection device will be called a "BVds type" hereinafter.

With this arrangement, a charge generated by application of the surge is discharged through the electrostatic protection device, so that the gate oxide of the internal circuit is protected from the breakdown.

For realizing a high speed operation and a high integration density of the LSI, it is indispensable to reduce the thickness of the gate oxide film, with the result that the surge withstanding property of the gate oxide film inevitably lowers. In the above mentioned "BVds type" of electrostatic protection device, the surge is applied not only to the gate oft the internal circuit but also between the drain and the gate of each of the MOS transistors TP and TN in the electrostatic protection device. If the gate oxide film becomes thin, the oxide film in proximity of the drain becomes to be easily destroyed before carriers are escaped through a source-drain path. In order to overcome this problem, it may be considered to enlarge the size of the electrostatic protection device so as to increase a parasitic capacitance. However, this approach is not suitable to the increase of the integration density of the LSI.

On the other hand, with multi-function of the LSI, there is required an input/output buffer suitable to a level conversion circuit and an active line insertion. In this buffer, a voltage of the input terminal becomes larger than VDD in the course of an operation, in some cases. In this case, a forward direction current flows through a drain-substrate path of the transistor TP in the "BVds type" of electrostatic protection device.

In order to overcome the above mentioned problem, it is known to use a field gate transistor (VT2 transistor) as an electrostatic protection device. For example, as shown in FIG. 2, the input protection circuit is constituted by connecting a field gate transistor QB between the power supply voltage VDD and the input terminal IN and another field gate transistor QB between the input terminal IN and the ground GND.

Figure 2:
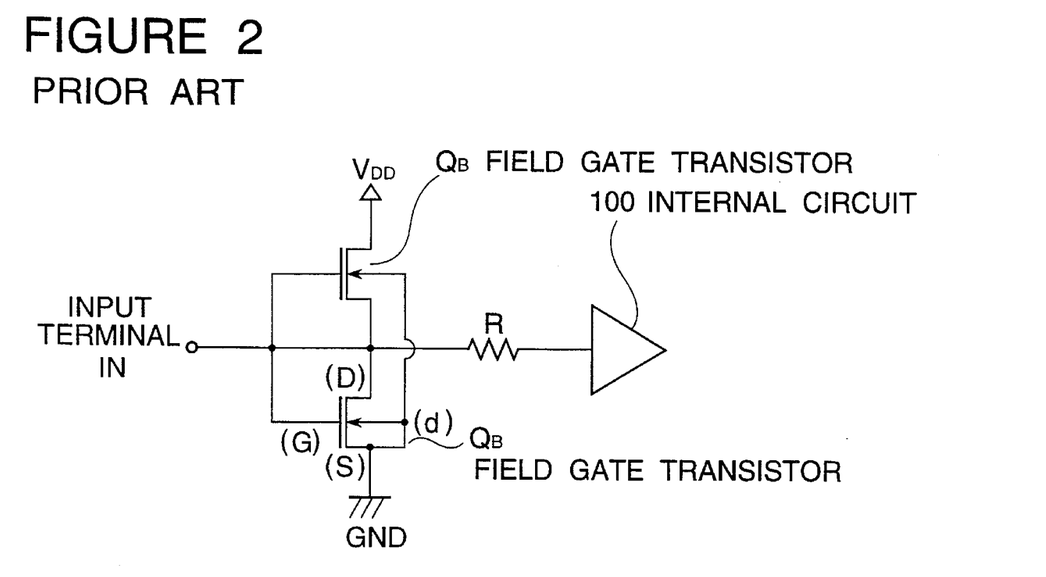
FIG. 2 is a circuit diagram of a second conventional electrostatic protection circuit including an electrostatic protection device.
Figure 3:
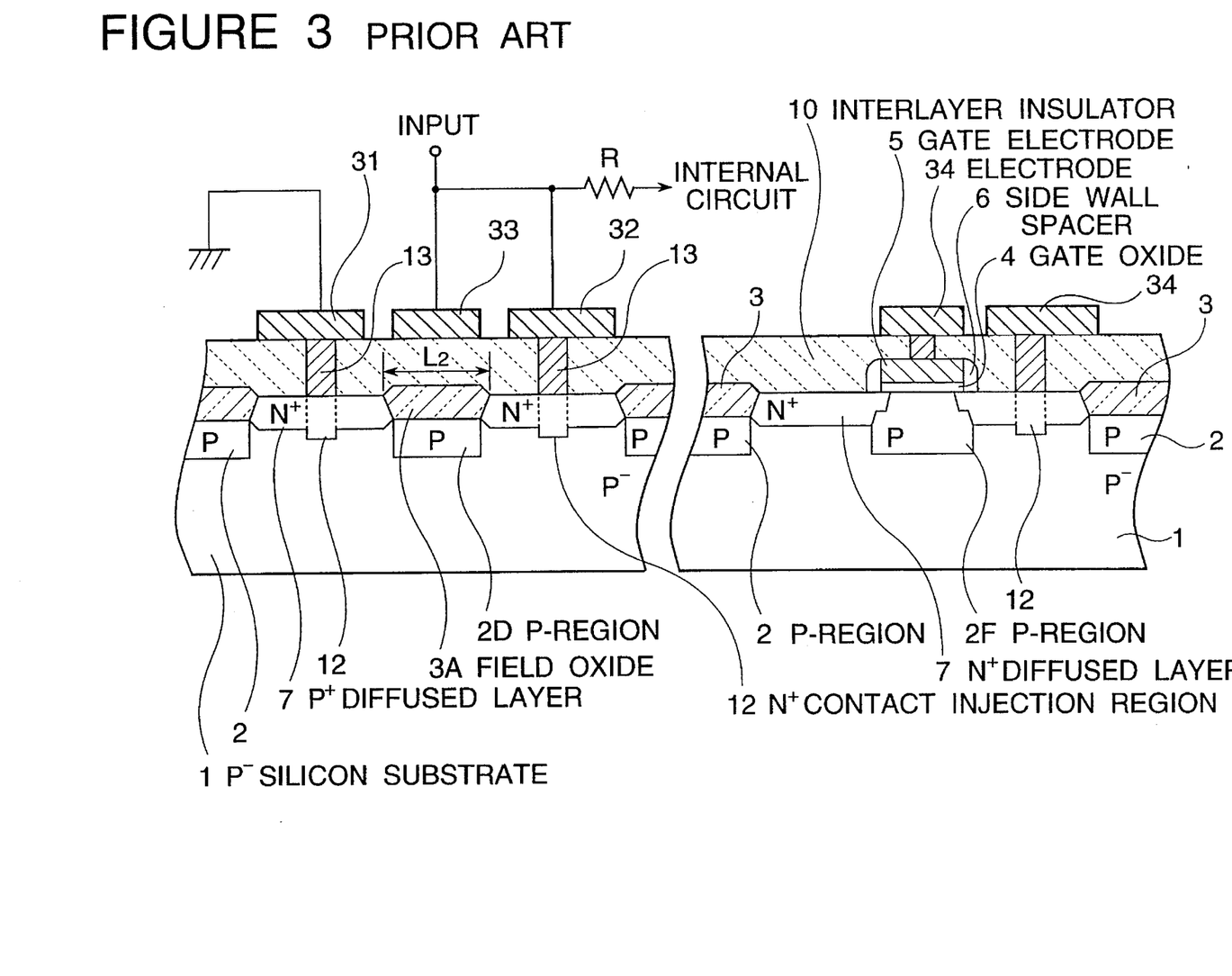
FIG. 3 is a diagrammatic sectional view of the field gate transistor used in the electrostatic protection device shown in FIG. 2 and the NMOS transistor connected to the electrostatic protection device.

Referring to FIG. 3, there is shown a diagrammatic section view of the field gate transistor and an NMOS transistor included in the internal circuit, for the purpose of illustrating the electrostatic protection device shown hi FIG. 2.

As shown in FIG. 3, field oxide films 3 and 3A are formed on a principal surface of a $P^-$ silicon substrate (or $P^-$ well) 1 in order to define device formation regions. Under these field oxide films 3 and 3A and under a channel forming region of the NMOS transistor, P regions 2, 2D and 2F are formed.

A gate oxide film 4 for the NMOS transistor zone, is formed on the channel forming region, and a gate electrode is formed on the gate oxide film 4, and a stacked structure of the gate oxide film 4 and the gate electrode is surrounded by a side wall spacer 6. $N^+$ diffused regions 7 are formed at a surface region of the $P^-$ silicon substrate 1 confined by the field oxide films 3 and 3A and at a surface region of the $P^-$ silicon substrate 1 confined by the field oxide film 3, the gate electrode 5 and the side wall spacer 6. An $N^+$ contact injection region 12 is formed by ion-implanting impurities through a contact hole formed through an interlayer insulator film 10, and a tungsten plug 13 is filled in the contact hole. In the field gate transistor, a source electrode 31 and a drain electrode 32 are connected through the tungsten plug 13 to the $N^+$ diffused regions 7 which constitute a source region and a drain region. A gate electrode 33 is formed on the interlayer insulator film 10 directly above the field oxide film 3A. Electrodes 34 of the NMOS transistor are connected through the tungsten plug 13 to corresponding ones such as the gate electrode 5 and the $N^+$ diffused region 7.

In the above mentioned structure, the field gate transistor is parasitic transistors having a source region and a drain region which are constituted by the $N^+$ diffused regions 7 adjacent to each other but isolated by the field oxide film 3A. The gate electrode 33 is connected to the drain electrode 32 and the input terminal IN, and also connected through a protection resistor R to the internal circuit 100.

For example, when a positive surge voltage is applied to the input terminal IN of the circuit shown in FIG. 2, the field gate transistor QB is mined on, and therefore, an on-current of the field gate transistor QB flows through a drain (D) - source (S) path, or a junction breakdown current flows through a drain (D) - substrate (d) path, so that a gate oxide film of a transistor in the internal circuit is protected from the surge.

Thus, the field gate transistor QB itself has a sufficient strength withstanding the surge. However, since This surge withstanding voltage of the field gate transistor QB is high as mentioned above, the function for protecting the internal circuit from the surge is low.

For example, in a CMOS LSI having a gate length on the order of 0.3 μm, a surface impurity concentration of the P type region is set to be on the order of $2\times10^{17}$ cm$^{-3}$ to $3\times10^{17}$ cm$^{-3}$. Therefore, the junction breakdown voltage between the $N^+$ diffused region 7 and the P type region 2D is on the order of 15 V even if the P type region were formed formed on the whole surface. In addition, since the thickness of the field oxide 3A and the interlayer insulator film 10 (constituting the gate insulator film of the field gate transistor) is set to be 1 μm or more in total. Therefore, the turning-on voltage of the field gate transistor itself is far higher than the above mentioned drain junction breakdown voltage.

On the other hand, the film thickness of the gate oxide film 4 in the MOS transistor in the internal circuit is set to be 7 nm to 8 nm in the case of the gate length 0.3 μm process. Therefore, if an intrinsic breakdown electric field of 10 MV/cm or more, namely, a voltage of 8 V or more is directly applied to the gate oxide, the gate oxide film is broken down or destroyed.

Considering only the DC current, in the CMOS LSI of the gate length 0.3 μm process incorporating therein the conventional electrostatic protection device, there is possibility that a bias on the order of 15 V far larger than the breakdown voltage of the gate oxide film is applied to the internal circuit. Considering a sufficient protection from the surge input which is practically a problem, it is necessary to cause the electrostatic protection device to have a very large parasitic capacitance for sufficiently lowering an initial voltage of the surge, with the result that the size of the electrostatic protection device becomes large. This is opposite to the high integration density of the LSI.

For example, in order to ensure the surge withstanding property without increasing the size of the electrostatic protection device, it is necessary to lower the breakdown voltage of the electrostatic protection device itself. For this purposes, two approaches may be considered. A first approach is to lower the breakdown voltage of the electrostatic protection device by causing a punch-through between the drain and the source of the field gate transistor. The second approach is to lower the breakdown voltage of the drain-substrate junction. A method for causing a punch-through between the drain and the source, includes (A) a method of lowering the concentration of the P-type region 2D isolating between the $N^+$ region and the $N^+$ region, and (B) a method of reducing the distance L2 of the separation between the $N^+$ region and the $N^+$ region.

Since the P-type regions 2D and 2F are formed in the same step, if the concentration of the P-type region 2D is lowered in accordance with the method (A), the concentration of the P-type region 2F in the NMOS transistor forming region is similarly lowered, with the result that a punch-through becomes to easily occur between the drain and the source of the NMOS transistor. Accordingly, a transistor having the gate length of a sub micron order becomes very difficult to design. Furthermore, another problem occurs in which there drops a turn-on voltage of a parasitic field gate transistor constituted of the gate of the gate oxide 33, the oxide film of the field oxide film 3 and source/drain regions of adjacent $N^+$ diffused regions separated by the field oxide film 3. Therefore, in order to avoid this problem, it is necessary to optimize the concentration of the two P-type regions. In the example shown in FIG. 3, however, this means that the P-type region 2D and the P-type region 2F must be formed m different steps, with the result that the number of photo masks and the steps of the manufacturing process are increased.

In the method (B) of reducing the distance L2 of the separation between the $N^+$ region and the $N^+$ region, since variation or fluctuation of the breakdown voltage is large, it is not possible to obtain a stable surge withstanding voltage. For example, assuming that the concentration of the P-type region 2D is $3 \times 10^{17}$ cm$^{-3}$, in order to obtain the punch-through withstanding voltage on the order of 8 V, the separation length L2 is required to be reduced to the order of 0.4 μm. Since the $N^+$—$N^+$ separation length L2 is determined by the length of the field oxide film 3, a stable size cannot be obtained due to manufacturing variations or fluctuations in various factors such as a precision degree of a photo resist for defining the field oxide film region, a bird's beak length and the field oxide film thickness. In other words, the punch-through withstanding voltage inevitably becomes large in variation.

Finally, the method of lowering the breakdown voltage of the drain-substrate junction includes increasing the concentration of the P-type region 2D. However, in order to lower the breakdown voltage of the drain-substrate junction with giving no influence to the characteristics of the NMOS transistor, it is necessary to increase the concentration of only the P-type region 2D. Therefore, the P-type region 2D and the P-type region 2F must be formed in different steps, with the result that the number of photo masks and the steps of the manufacturing process are increased.

SUMMARY OF THE INVENTION

Accordingly, it is an object of the present invention to provide an electrostatic protection device for use in a semiconductor integrated circuit, which has overcome the above mentioned defect of the conventional one.

Another object of the present invention is to provide an electrostatic protection device for use in a semiconductor integrated circuit, which has a reduced breakdown voltage without increasing the size of the electrostatic protection device.

The above and other objects of the present invention are achieved in accordance with the present invention by an electrostatic protection device for use in a semiconductor integrated circuit, the device including a base region of a first conductivity type formed at a principal surface of a semiconductor substrate, a plurality of collector regions constituted of a plurality of first diffused regions of a second conductivity type opposite to the first conductivity type, the first diffused regions being formed on a surface of the base region in the form of a plurality of strips parallel to each other but separate from each other, emitter regions constituted of a second diffused region of the second conductivity type formed in the form of a strip between each pair of adjacent collector regions of the plurality of collector regions and a third diffused region of the second conductivity type formed under a contact hole formed in at least one portion of a boundary region at a side of the second diffused region adjacent to the collector region, the third diffused region being connected to the second diffused region, and a base contact region of the first conductivity having a high impurity concentration formed within the base region so as to substantially surround the collector regions and the emitter regions.

The above and other objects, features and advantages of the present invention will be apparent from the following description of preferred embodiments of the invention with reference to the accompanying drawings.

DESCRIPTION OF THE PREFERRED EMBODIMENTS

Figure 4:
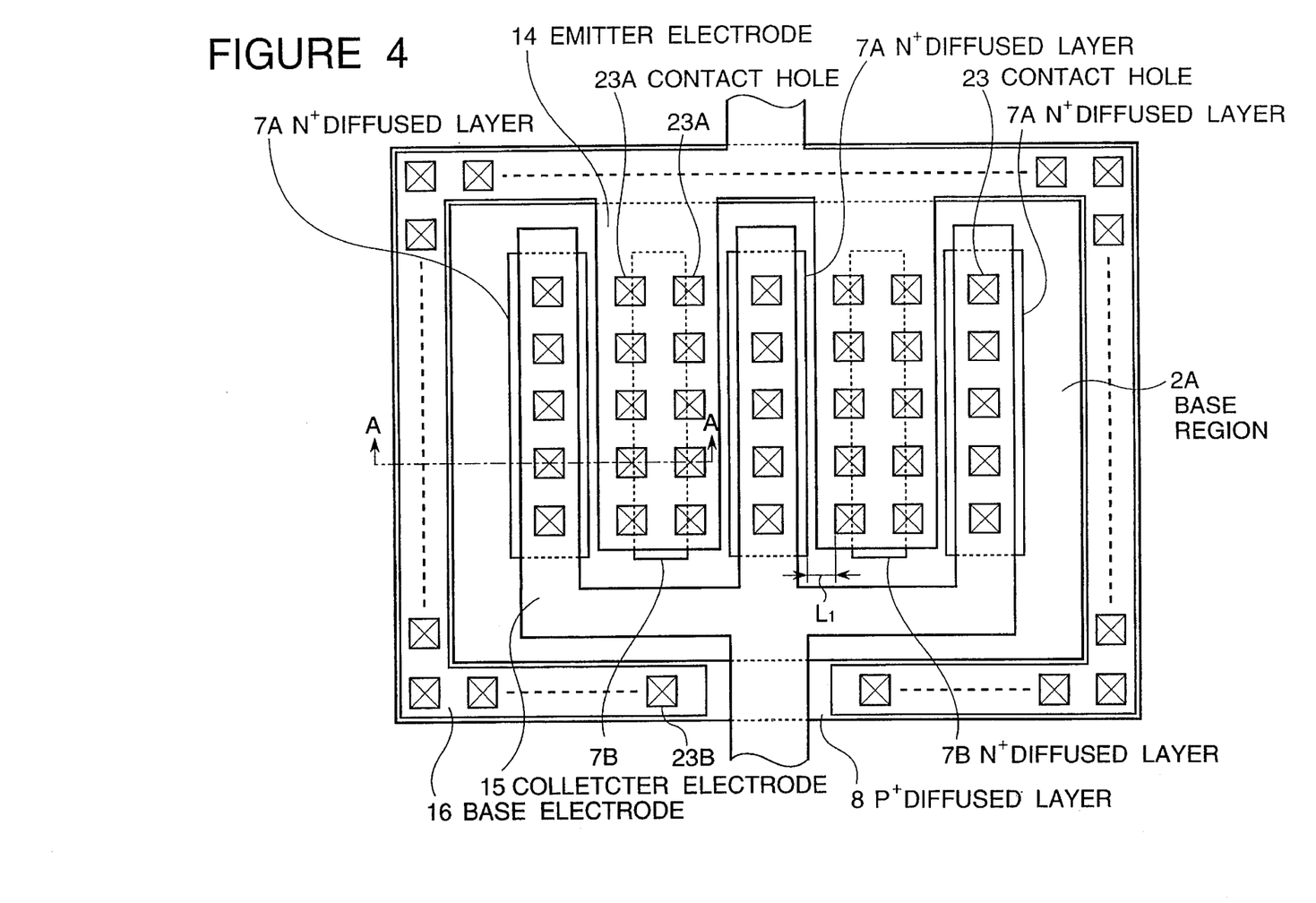
FIG. 4 is a diagrammatic plan view of a first embodiment of the electrostatic protection device in accordance with the present invention.

Referring to FIG. 4, there is shown a diagrammatic plan view of a first embodiment of the electrostatic protection device in accordance with the present invention.

As shown in FIG. 4, on a surface of a P-type base region 2A formed in a P⁻ silicon substrate, there are formed a plurality of collector regions composed of N⁺ diffused regions 7A each in the form of a strip in parallel to each other and separated from each other. Emitter regions are formed of N⁺ diffused regions 7B each in the form of a strip formed between each pair of adjacent N⁺ diffused regions 7A, but separated from and in parallel to these N⁺ diffused regions 7A. The Emitter regions also include N⁺ contact injection regions which are buried under contact holes formed at a boundary of the N⁺ diffused regions 7B adjacent to the N⁺ diffused regions 7A (collector region) and which are connected to the N⁺ diffused regions 7B. The above mentioned base region 2A has a P⁺ diffused region 8 formed to surround the collector regions and the emitter regions.

A collector electrode 15 is connected to the collector regions (N⁺ diffused regions 7A) through contact holes 23, and is connected to an input terminal and an internal circuit (not shown in FIG. 4). An emitter electrode 14 is connected to the emitter regions (N⁺ diffused regions 7B) through contact holes 23. A base electrode 16 is connected to the base region (P⁺ diffused region 8) through contact holes 23B. Thus, a punch-through transistor is constituted.

In the case of using this punch-through transistor as an electrostatic protection device between the input terminal and the ground, the emitter electrode 14, and the base electrode 16 are connected in common to the ground line. In the case of using the punch-through transistor as an electrostatic protection device between the input terminal and the power supply voltage, the emitter electrode 14 is connected to the power supply voltage.

The punch-through withstanding voltage of this punch-through transistor is determined by a distance L1 between the N⁺ diffused regions 7A and the N⁺ contact injection regions of the emitter regions. Therefore, it is possible to easily realize a very short distance L1 which is 0.4 μm or less, which cannot be realized in the prior art.

Now, a process for manufacturing the first embodiment of the electrostatic protection device in accordance with the present invention shown in FIG. 4, will be described with reference to FIGS. 5A to 5E which are diagrammatic sectional views taken along the line A—A in FIG. 4 and diagrammatic sectional views of an NMOS transistor.

Figure 5A:
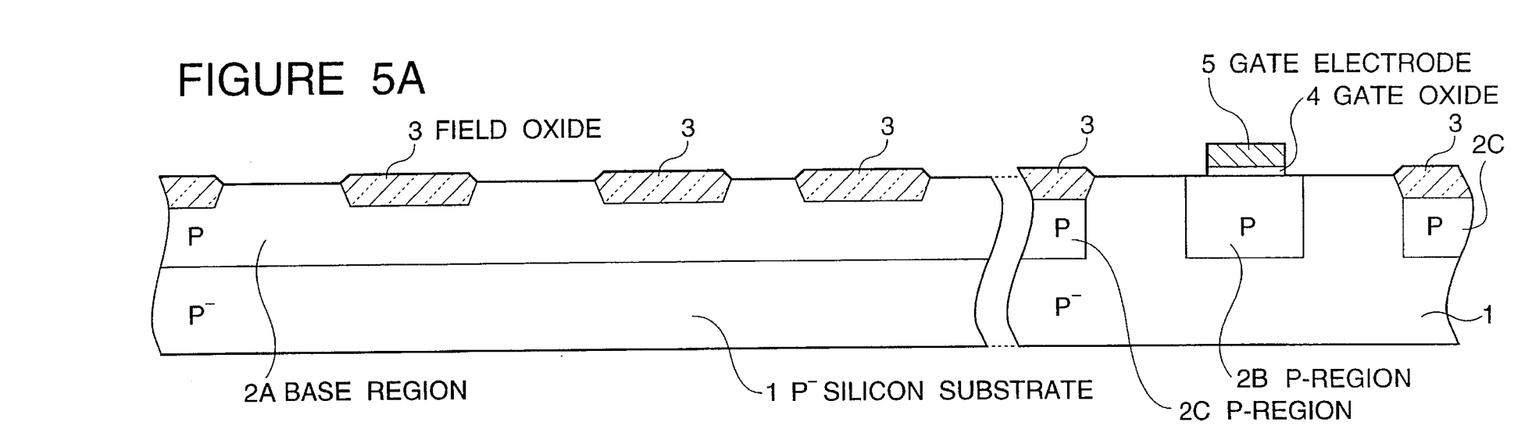
FIGS. 5A to 5E are diagrammatic sectional views illustrating a process for manufacturing the first embodiment of the electrostatic protection device in accordance with the present invention.

First, as shown in FIG. 5A, a field oxide film 3 having a thickness of 300 nm to 400 nm for a device isolation is formed by a selective oxidation on a principal surface of a P⁻ silicon substrate (or well) 1, so that a plurality of device formation regions are confined. Then, boron ions are selectively implanted with an acceleration energy of 160 keV and a dose of $5 \times 10^{12}$ cm$^{-2}$ to $1 \times 10^{13}$ cm$^{-2}$, so that a P-type base region 2A and P-type regions 2B and 2C for the NMOS transistor are formed. Furthermore, boron is shallowly ion-implanted to adjust a threshold $V_T$ of the NMOS transistor.

Thereafter, for the NMOS transistor, a gate oxide film 4 having a thickness of about 7 nm is selectively formed on the P-type regions 2B, and a gate electrode 5 having a double layered structure of a tungsten silicide layer and a P⁺ polysilicon film is formed on the gate oxide film 4.

Figure 5B:
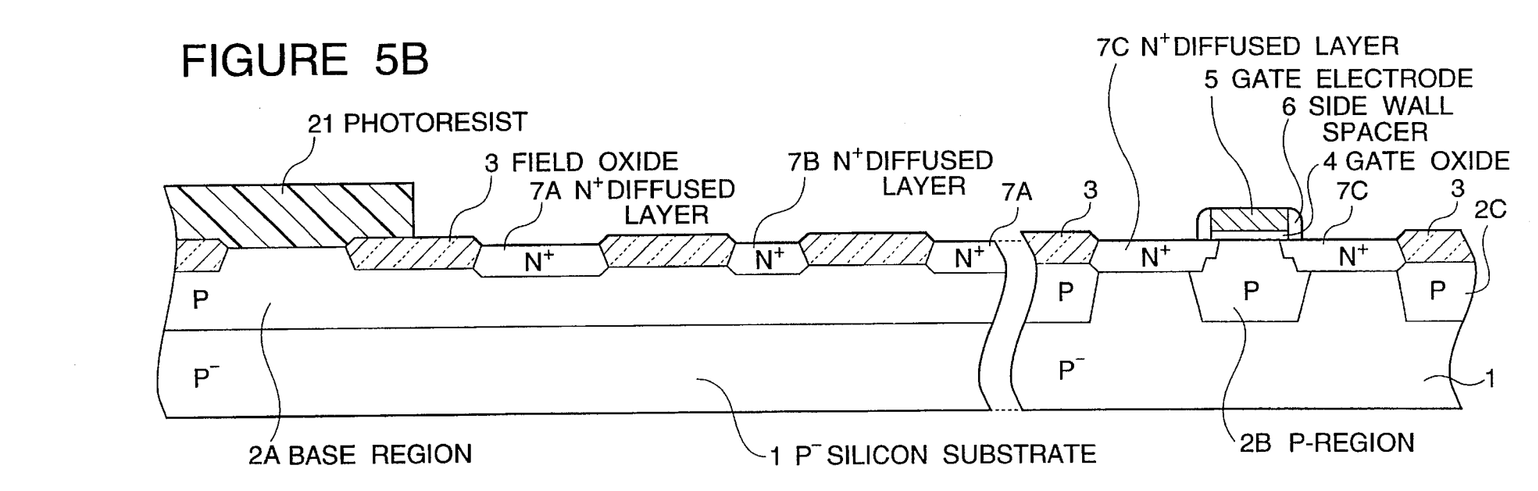

Next, as shown in FIG. 5B, phosphorus of a low concentration for forming a LDD (lightly doped drain) structure, is ion-implanted with using the gate electrode 5 as a mask, and then, a side wall spacer 6 is formed on each side wall of the gate electrode 5. Further, a photo resist film 21 is selectively formed, and arsenic ions are implanted with an acceleration energy of 50 keV and a dose of $3 \times 10^{15}$ cm$^{-2}$ to $5 \times 10^{15}$ cm$^{-2}$, using the photo resist film 21 as a mask, so that N⁺ diffused regions 7A (which become the collector of the punch-through transistor), an N⁺ diffused region 7B (which becomes the emitter of the punch-through transistor), and N⁺ diffused regions 7C (which become source/drain regions of the NMOS transistor), are formed.

Figure 5C:
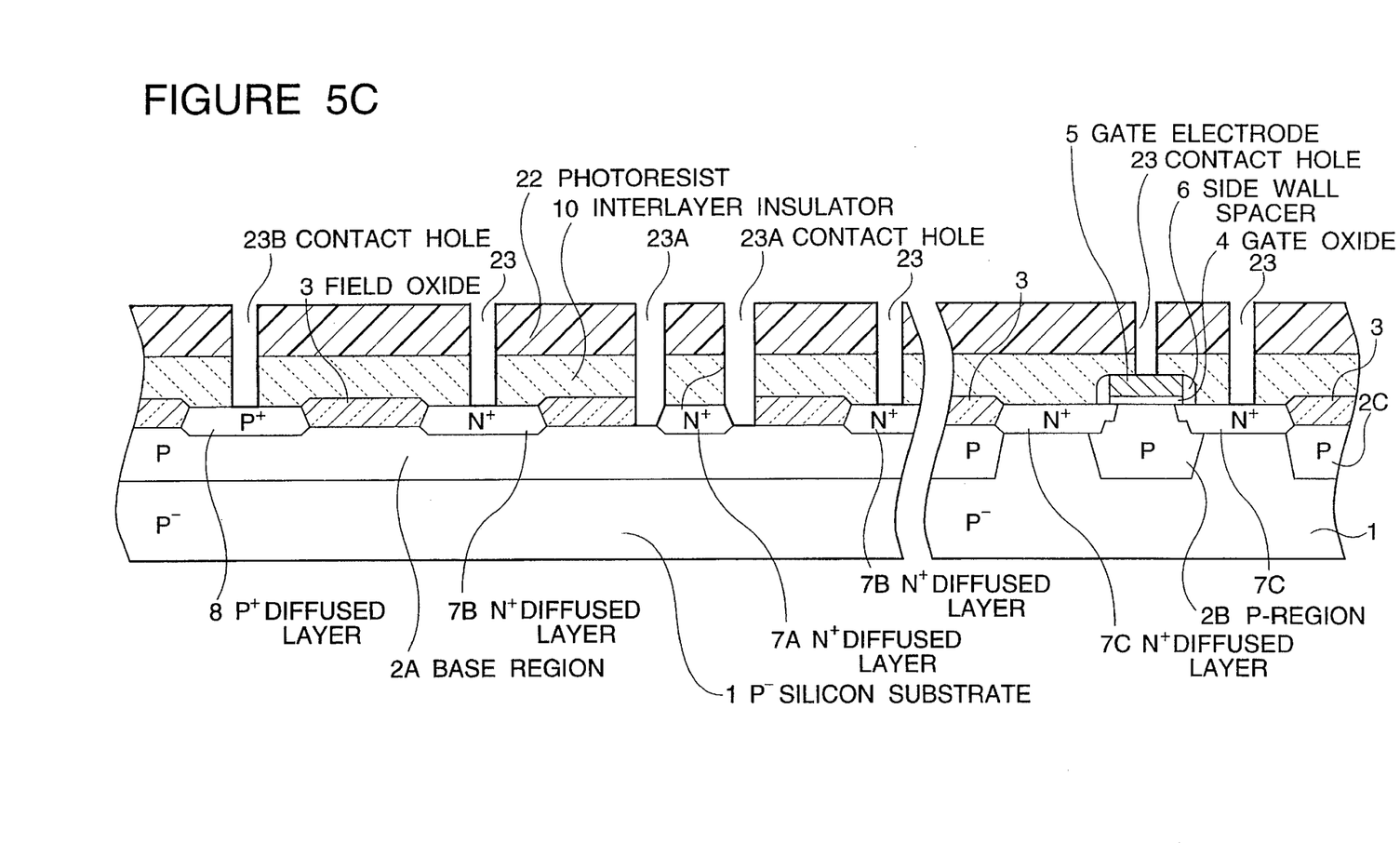

As shown in FIG. 5C, after the photo resist film 21 is removed, boron is selectively ion-implanted to form a P⁺ diffused region 8 which constitute a contact region for the base region 2A. Thereafter, an interlayer insulating film 10 having a thickness on the order of 1 μm is deposited on the whole surface, and a photo resist film 22 is formed on the interlayer insulating film 10 and then patterned. By using the patterned photo resist film 22 as a mask, the interlayer insulating film 10 is anisotropically etched to form contact holes 23, 23A and 23B. At this time, at a bottom 23A formed in a boundary of the emitter regions of the punch-through transistor, the field oxide film 3 is simultaneously removed so that a surface of the base region 2A is exposed.

Figure 5D:
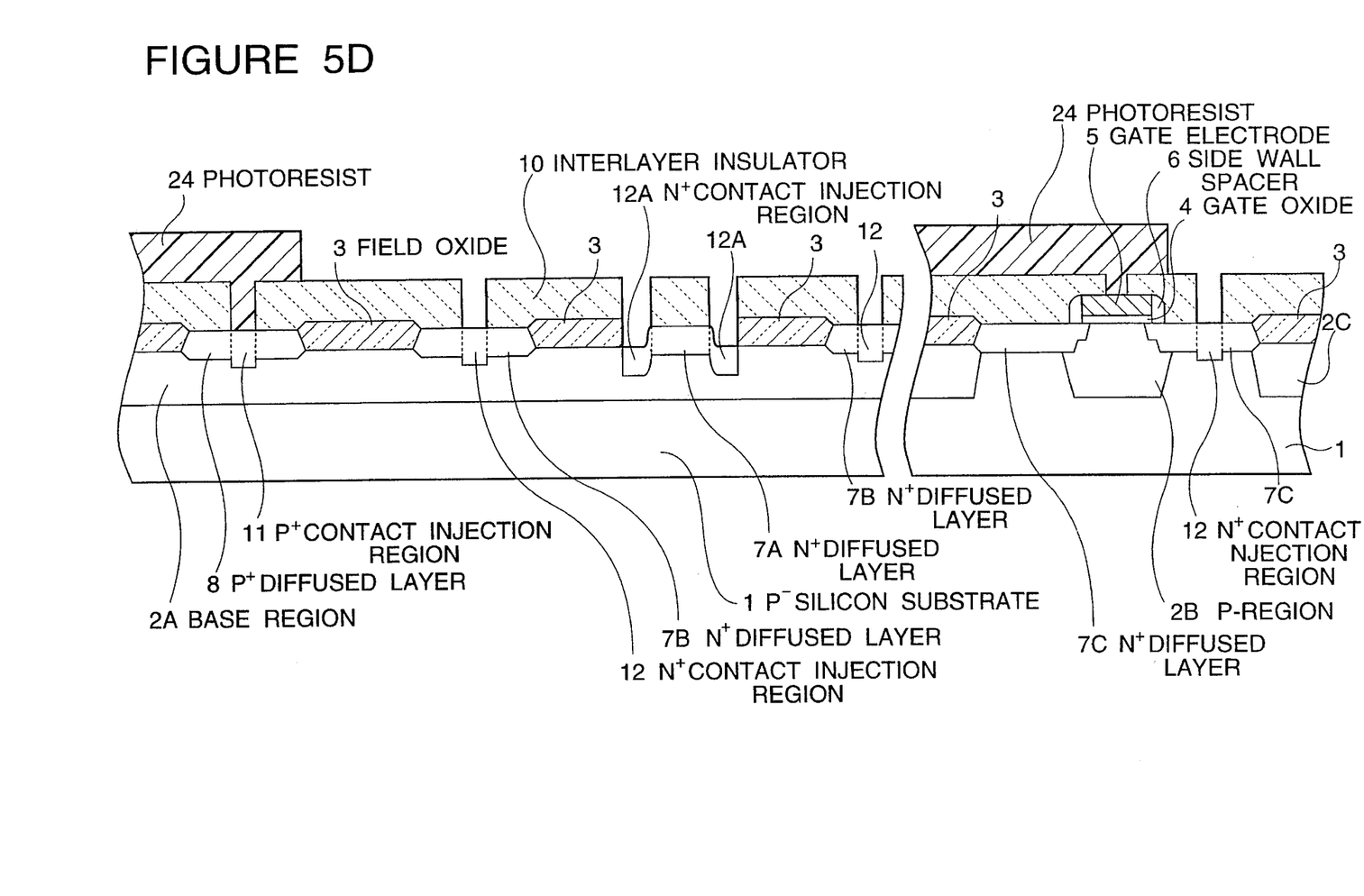

Then, as shown in FIG. 5D, after the photo resist film 22 is removed, boron is selectively ion-implanted to form a P⁺ contact injection region 11 in the P⁺ diffused region 8 within the contact hole 23B. Furthermore, a photo resist film 24 is deposited on the whole surface, and then patterned. By using the patterned photo resist 24 as a mask, phosphorus ions are implanted into the N⁺ diffused regions 7A, 7B and 7C within the contact holes 23 and 23A, with an acceleration energy of 80 keV and a dose of $5 \times 10^{15}$ cm$^{-2}$, so that N⁺ contact injection regions 12 are formed. At this time, in the contact holes 23A, an N⁺ contact injection regions 12A is formed which is connected to the N⁺ diffused region 7A and which is deeper than the diffusion depth of the N⁺ diffused regions 7A and 7B which constitute an emitter region and a collector region of the punch-through transistor. With this structure, the emitter region is composed of N⁺ diffused region 7A and the N⁺ contact injection regions 12A.

Figure 5E:
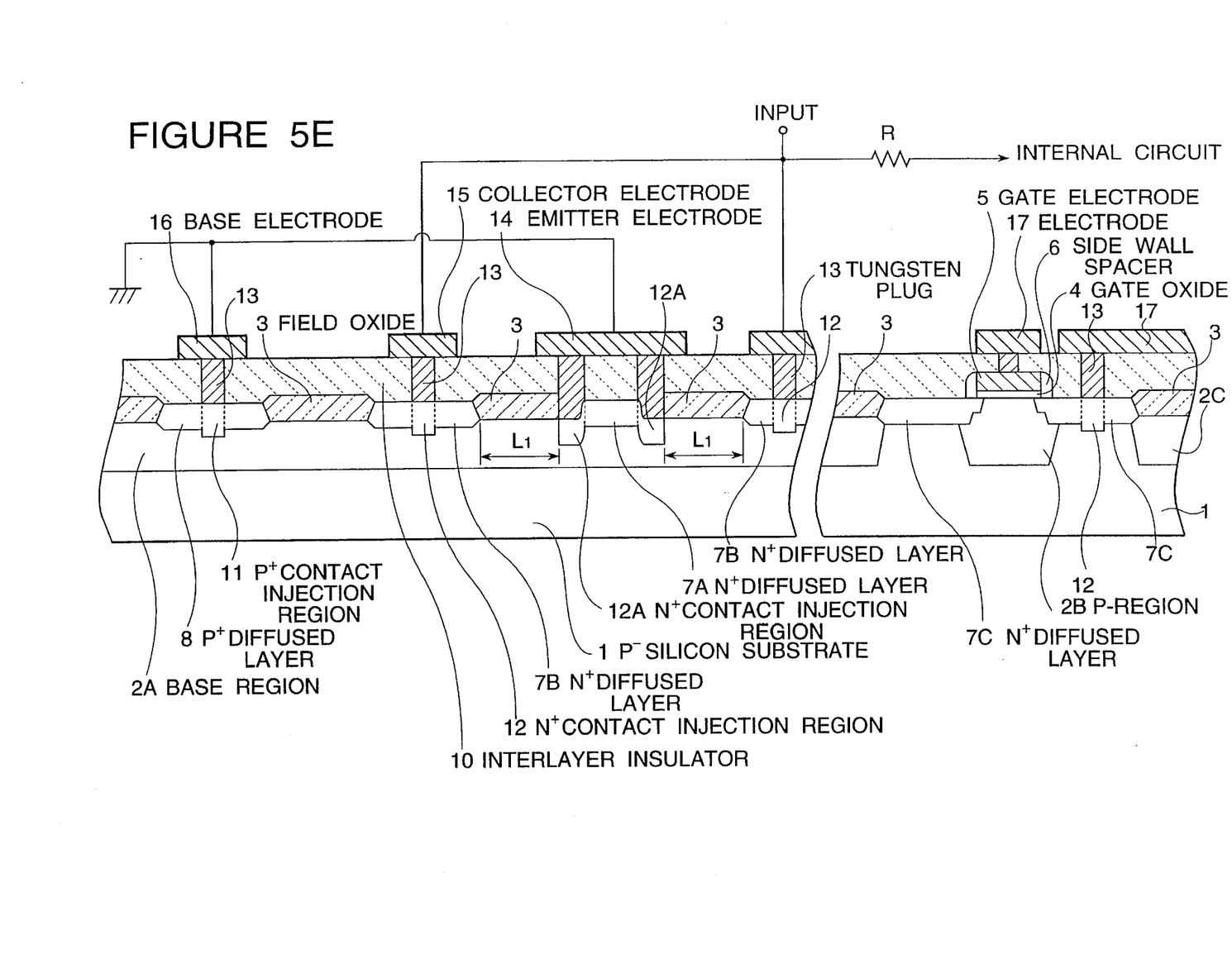

Thereafter, as shown in FIG. 5E, after the photo resist 24 is removed, a barrier metal film (not shown in the drawing) having a Ti/TiN layered structure is formed on the surface including the contact holes 23, 23A and 23B, and then, a tungsten film 13 is deposited and further etched back so as to fill the contact holes 23, 23A and 23B with tungsten. Namely, tungsten plugs 13 are formed. Moreover, a metal film formed of an Al-Si-Cu alloy is deposited on the interlayer insulator film 10 including the tungsten plugs 13, and then, patterned to form the emitter electrode 14, the collector electrode 15 and the base electrode 16 of the punch-through transistor and the electrodes 17 for the NMOS transistor.

The emitter electrode 14 and the base electrode 16 of the punch-through transistor am connected in common to the ground line, and the collector electrode 15 of the punch-through transistor connected to the input terminal is connected through the protection resistor R to the internal circuit.

Figure 6:
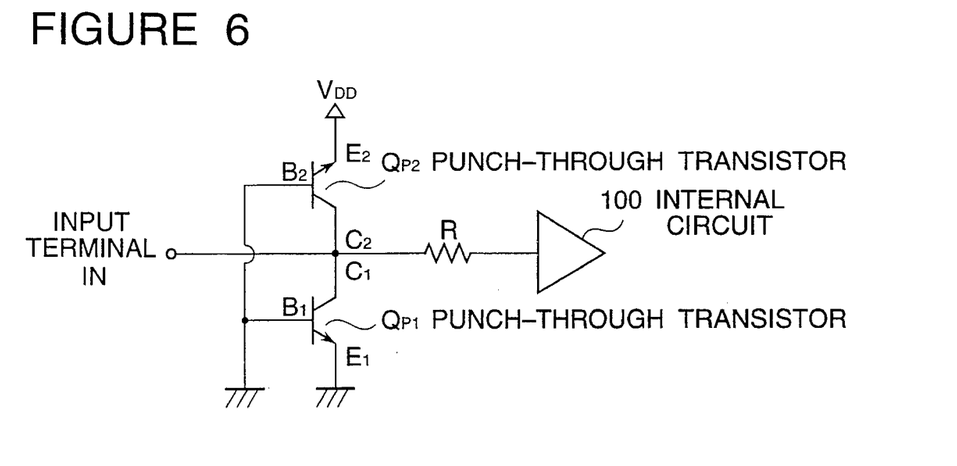
FIG. 6 is a circuit diagram of the first embodiment of the electrostatic protection device in accordance with the present invention.

The above mentioned punch-through transistor is connected between the input terminal and the ground line. However, generally, as shown in FIG. 6, the electrostatic protection device is formed of a first punch-through transistor QP1 having a collector connected to the input terminal IN, and a base and an emitter connected in common to the ground, and a second punch-through transistor QP2 having a collector connected to the input terminal IN, a base connected to the ground and an emitter connected to a power supply voltage VDD. The input terminal IN connected to the collector of each of the punch-through transistor QP1 and QP2 is connected through the protection resistor R to the internal circuit.

Figure 7:
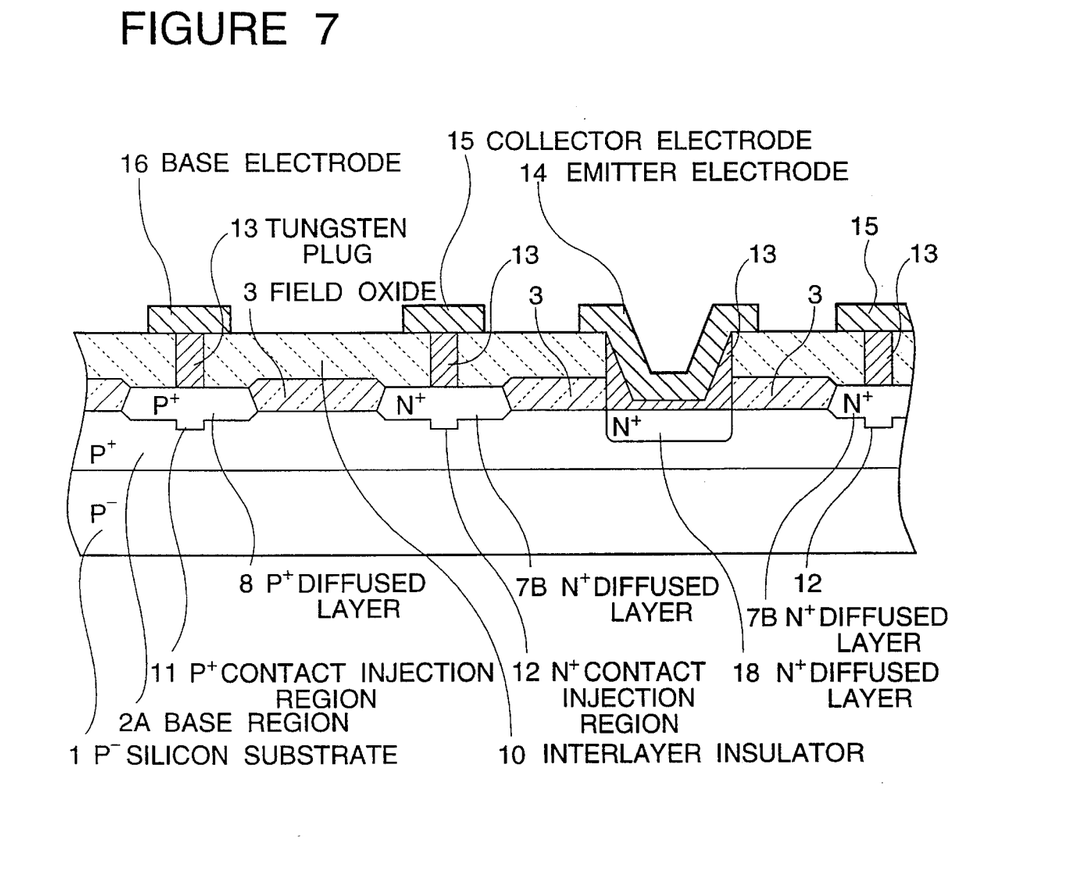
FIG. 7 is a diagrammatic sectional view of a second embodiment of the electrostatic protection device in accordance with the present invention.

Referring to FIG. 7, them is shown a diagrammatic sectional view of a second embodiment of the electrostatic protection device in accordance with the present invention. In FIG. 7, elements similar to those shown in FIG. 5E are given the same Reference Numerals, and explanation thereof will be omitted for simplification of description.

In this second embodiment, the emitter region is formed of an $N^+$ diffused region 18, which is formed by ion-implanting arsenic to the whole surface of the base region 2A exposed in an opening which is formed by sequentially etching the interlayer insulator film 10 and the field oxide film 3 in the whole of the emitter forming region for the punch-through transistor. With this arrangement, a punch-through current flowing from the collector region to the emitter region is prevented from being locally concentrated, so that the punch-through current flows evenly in a width of the emitter region. Accordingly, the emitter resistance is reduced, and a high electrostatic breakdown voltage can be obtained. In addition, it is easy to reduce the emitter length. Therefore, this structure is effective in reducing the occupying area of the protection circuit.

Figure 8:
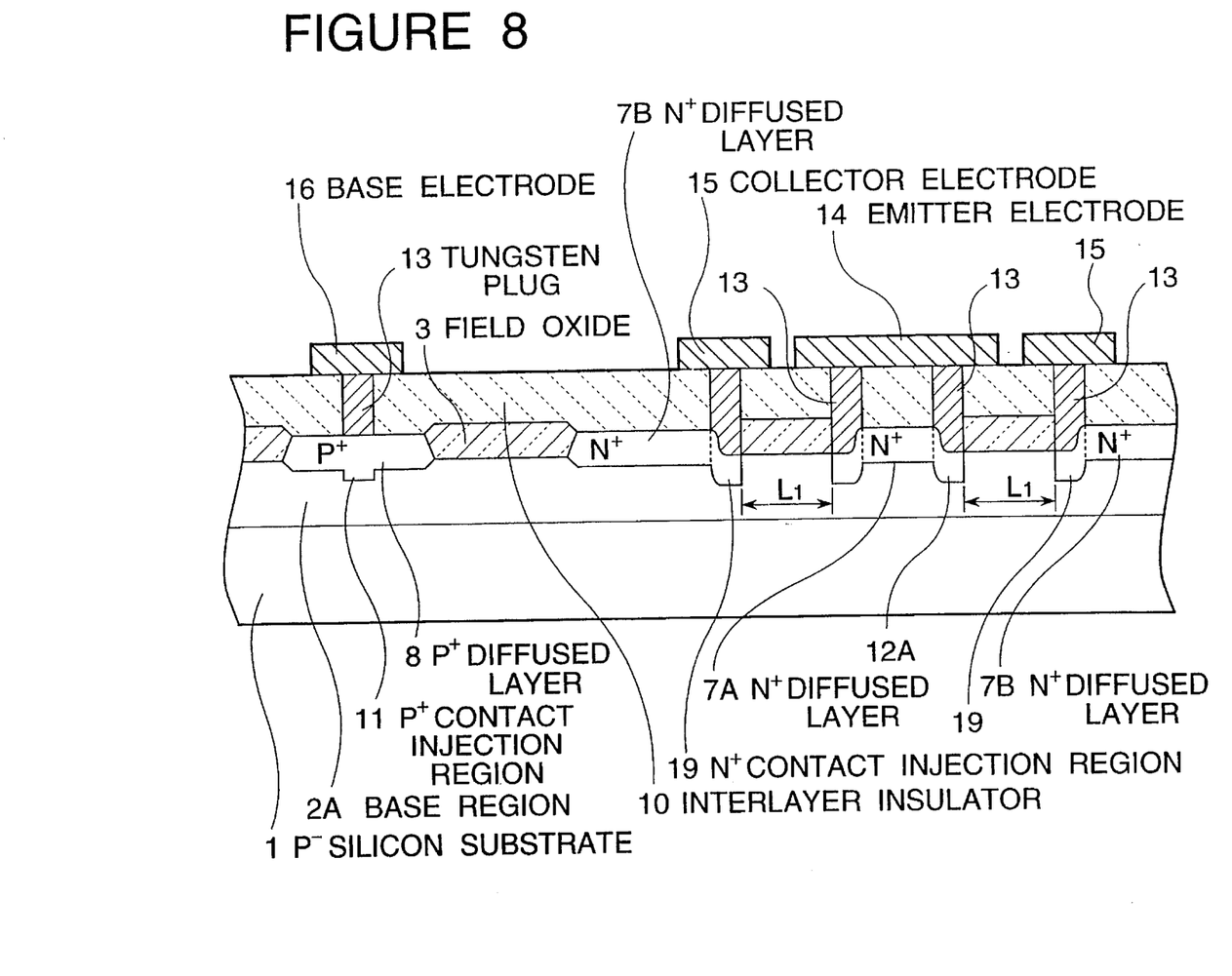
FIG. 8 is a diagrammatic sectional view of a third embodiment of the electrostatic protection device in accordance with the present invention.

Referring to FIG. 8, there is shown a diagrammatic sectional view of a third embodiment of the electrostatic protection device in accordance with the present invention. In FIG. 8, elements similar to those shown in FIG. 5E are given the same Reference Numerals, and explanation thereof will be omitted for simplification of description.

This third embodiment includes an $N^+$ contact injection regions 19 formed at a boundary of the $N^+$ diffused regions 7B adjacent to the $N^+$ contact injection regions 12A.(emitter region) formed at a deep region of the base region 2A. In this embodiment, the punch-through withstanding voltage is determined by a distance between the $N^+$ contact injection regions 12A and the $N^+$ contact injection regions 19. Even if a misalignment occurs between the contact injection region and the field oxide film, this misalignment has no adverse influence to the punch-through withstanding voltage. Therefore, a stable electrostatic breakdown voltage of the protection circuit can be obtained.

For example, in the case that the base region 2A and the P-type regions 2B and 2C have the impurity concentration of $3\times10^{17}$ cm$^{-3}$ in order to stably manufacture the MOS transistor having the gate length on the order of 0.3 μm, the conventional example has such a restriction that in the case of the distance L2=0.45 μm, the punch-through withstand voltage cannot be reduced to a value less than 10 V. In the present invention, the distance L1=0.35 μm can be realized, and in this case, the punch-through withstand voltage of about 6 V can be obtained. In addition, even if the impurity concentration of the base region 2A and the P-type regions 2B and 2C is elevated to $5\times10^{17}$ cm$^{-3}$ in order to realize the MOS transistor having the gate length on the order of 0.25 μm, the distance L1=0.25 μm can be realized in accordance with the present invention, and in this case, the punch-through withstand voltage of about 5 V can be obtained.

As seen from the above, the punch-through transistor is used as the electrostatic protection element, and the distance between the base region and the emitter region determining the punch-through withstanding voltage can be reduced to a very short value of 0.4 μm or less, by setting a distance between the collector region and the contact injection region formed at the boundary of the field oxide film adjacent to the collector region, or a distance between contact injection regions formed at the boundary of the emitter region and the collector regions adjacent to each other. Accordingly, it is easy to obtain an electrostatic protection device having a low breakdown voltage.

If the breakdown voltage of the electrostatic protection device is lowered, a generated electric charge can be discharged through the electrostatic protection device with a reduced surge voltage. Therefore, the electrostatic protection capability is elevated. In addition, this advantage can be obtained without increasing the size of the electrostatic protection device. Therefore, the present invention can be effective in realizing a high integration density. Accordingly, even if the thickness of the gate oxide film of the MOS transistor is reduced to 5 nm or less with a high speed operation and a high integration density of the LSI, a required electrostatic withstanding capability can be obtained in accordance with the present invention.

The invention has thus been shown and described with reference to the specific embodiments. However, it should be noted that the present invention is in no way limited to the details of the illustrated structures but changes and modifications may be made within the scope of the appended claims.

I claim:

1. An electrostatic protection device for use in a semiconductor integrated circuit, the device including a base region of a first conductivity type formed at a principal surface of a semiconductor substrate, a plurality of collector regions constituted of a plurality of first diffused regions of a second conductivity type opposite to said first conductivity type, said first diffused regions being formed on a surface of said base region in the form of a plurality of strips parallel to each other but separate from each other, emitter regions constituted of a second diffused region of said second conductivity type formed in the form of a strip between each pair of adjacent collector regions of said plurality of collector regions and a third diffused region of said second conductivity type formed under a contact hole formed in at least one portion of a boundary region at a side of said second diffused region adjacent to said collector region, said third diffused region being connected to said second diffused region, and a base contact region of said first conductivity having a high impurity concentration formed within said base region so as to substantially surround said collector regions and said emitter regions.

2. An electrostatic protection device claimed in claim 1 wherein all of said second diffused region in the form of the strip of said emitter regions are formed of a diffused region of said second conductivity type formed under contact holes formed at a boundary of said collector regions.

3. An electrostatic protection device claimed in claim 1 further including a diffused region of said second conductivity type formed under contact holes formed at a boundary of said collector regions.adjacent to said third diffused region of said second conductivity type.

* * * * *